US008465810B2

(12) United States Patent
Umino (10) Patent No.: US 8,465,810 B2
(45) Date of Patent: Jun. 18, 2013

(54) METHOD AND DEVICE FOR FORMING PIEZOELECTRIC/PYROELECTRIC FILM

(75) Inventor: Yuji Umino, Fukushima (JP)

(73) Assignee: MUNEKATA Co., Ltd., Fukushima-shi (JP)

( * ) Notice: Subject to any disclaimer, the term of this patent is extended or adjusted under 35 U.S.C. 154(b) by 0 days.

(21) Appl. No.: 13/359,909

(22) Filed: Jan. 27, 2012

(65) Prior Publication Data

US 2012/0321818 A1 Dec. 20, 2012

(30) Foreign Application Priority Data

Jun. 20, 2011 (JP) .................................. 2011-136583

(51) Int. Cl.
*B05D 1/04* (2006.01)
*B05B 5/025* (2006.01)

(52) U.S. Cl.
USPC ........................................... 427/475; 427/483

(58) Field of Classification Search
USPC .......................................................... 427/475
See application file for complete search history.

(56) References Cited

U.S. PATENT DOCUMENTS

| 6,331,330 | B1 * | 12/2001 | Choy et al. ...................... 427/475 |
| 7,252,851 | B2 * | 8/2007 | Selman et al. .................. 427/115 |
| 2003/0139064 | A1 * | 7/2003 | Nishida et al. ................. 438/785 |
| 2007/0042111 | A1 * | 2/2007 | Koyama ....................... 427/421.1 |

FOREIGN PATENT DOCUMENTS

| JP | 05-311399 A | 11/1993 |
| JP | 07-11424 A | 1/1995 |
| JP | 07-55300 | 6/1995 |
| JP | 2006-188046 A | 7/2006 |
| JP | 2009-501826 | 1/2009 |
| JP | 2009-231417 A | 10/2009 |
| JP | 2010-64284 | 3/2010 |
| JP | 2010-228993 | 10/2010 |
| WO | 2010/116802 | 10/2010 |

OTHER PUBLICATIONS

Earozoru Kenkyu, Nanoparticle Synthesis With Electrospray Using Rectangular AC High Voltage, 23(2), 94-100 (2008).
Monolithic Pyroelectric Infrared Image Sensor Using PVDF Thin Film, R&D Review of Toyota CRDL, vol. 33, No. 1, 1998.3.

* cited by examiner

*Primary Examiner* — Timothy Meeks
*Assistant Examiner* — Ina Agaj
(74) *Attorney, Agent, or Firm* — McGlew and Tuttle, P.C.

(57) ABSTRACT

An electric field is formed between a material to be coated 18 and a coating sprayer 4 by applying a high voltage of −1 kV to −90 kV to an electrode needle 7 at a tip of the coating sprayer 4, while maintaining the material to be coated 18 positively. An inert gas is sprayed from an inert gas spraying nozzle 8 to the material to be coated 18, and a solution having a dielectric substance dissolved in a solvent is simultaneously sprayed from a dielectric solution spraying nozzle 6, while giving negative charge to the dielectric solution, to form a precursor polarization film. The solution is discharged from the spraying nozzle 6 by injecting the inert gas in the spraying nozzle 6. Then, the electric field is formed again and the precursor polarization film is further polarized, to thereby form a piezoelectric/pyroelectric film on the material to be coated 18.

7 Claims, 7 Drawing Sheets

DISTANCE BETWEEN ELECTRODE NEEDLE AND MATERIAL TO BE COATED (mm)

FIG. 8

METHOD AND DEVICE FOR FORMING PIEZOELECTRIC/PYROELECTRIC FILM

CROSS REFERENCE TO RELATED APPLICATIONS

This application claims the benefit of priority under 35 U.S.C. §119 of Japanese Patent Application 2011-136583 filed Jun. 20, 2011, the entire contents of which are incorporated herein by reference.

FIELD OF THE INVENTION

The present invention relates to a method and a device for forming piezoelectric/pyroelectric films, in which electric field coating is performed by using a dielectric solution having an organic/inorganic material that is made from a dielectric substance and is dissolved or dispersed in a solvent, and at the same time, a film coated on a material to be coated is polarized.

BACKGROUND OF THE INVENTION

In forming conventional piezoelectric/pyroelectric films, a solution casting method or a melt-stretching method is commonly used. According to both of the methods, a formed film undergoes a stretching process, a thermal process, and a process applying a high voltage to orient directions of electric dipoles of molecular chains in the film to one direction (polarization process). Thereafter the electrode is coated on both surfaces of the film using a sputtering method, a silk printing method or the like, to thereby obtain a piezoelectric/pyroelectric film.

As such a polarization method which applies the high voltage to the film after the solution casting and melt-stretching in forming the piezoelectric/pyroelectric films, FERROELECTRIC CAST FILM AND ITS MANUFACTURING METHOD (Japanese Unexamined Patent Application Publication No. 2010-64284) or NON-POROUS POLYVINYLIDENE FLUORIDE (PVDF) FILMS IN THE BETA PHASE AND PROCESSING METHOD THEREOF (Japanese Unexamined Patent Application Publication (Translation of PCT Application) No. 2009-501826) is disclosed.

However, both of the above publications have a large number of operation steps because after the film is formed, the high voltage is applied thereto and then the film is polarized. Also, since each of these employs the casting method, there is a limit in atomization of the solution. According to the Japanese Unexamined Patent Application Publication No. 2009-501826, the film is formed using the casting method and the press-stretching method, and hence there are three multiple processes of drying, pressing and stretching after cast coating. Also, it cannot deal with a three-dimensional and large-sized material.

Next, PRODUCTION OF ORGANIC PYROELECTRIC AND PIEZOELECTRIC BODY AND DEVICE THEREFOR (Japanese Unexamined Patent Application Publication No. Hei 07-11424) or METHOD FOR FORMING ORGANIC PYROELECTRIC AND PIEZOELECTRIC BODY (Japanese Unexamined Patent Application Publication No. Hei 05-311399) is disclosed as a conventional polarization method.

However, according to the above two publications, a material to be polarized (corresponding to a material to be coated according to the present invention) is polarized in batch units using a vacuum chamber, which makes it disadvantageous for continuous mass production. Moreover, in such a polarization device, a negative electrode for supplying a high voltage and forming electric field between the material to be polarized is fixed or movable only in a uniaxial horizontal direction. Therefore, a polarization film can only be formed on a planar-shaped material to be polarized, not on a three-dimensional material.

In these two publications, there is also a limit in atomization of the solution.

There is also a known method to perform spraying and polarizing simultaneously, by applying a high voltage directly to a dielectric solution inside a solution cylinder, and dropping the solution to a material to be coated, where an electric field is formed between the solution cylinder and the material to be coated, to thereby achieve polarization before the solution reaches the material to be coated.

This method is disclosed in METHOD AND APPARATUS FOR PRODUCING MOLECULAR CRYSTALLINE THIN FILM (Japanese Examined Patent Application Publication No. Hei 07-55300), PRODUCTION METHOD OF DIELECTRIC PARTICLE AGGREGATE (Japanese Unexamined Patent Application Publication No. 2010-228993) or NANOPARTICLE SYNTHESIS WITH ELECTROSPRAY USING RECTANGULAR AC HIGH VOLTAGE (EAROZORU KENKYU. 23(2), 94-100 (2008)).

According to such known methods, however, a dielectric solution, in which a dielectric substance is dissolved and dispersed in a solvent, has a low electrical resistance value (approximately 0 to 200 k$\Omega$, close to water with impurities mixed therein). Therefore, when a high voltage is applied to the solution, an electric current leaks to a solution tank grounded through a solution supply route, whereby a voltage and electric field toward the material to be coated become lower. Also, when performing electrospray coating by using an industrial paint including an organic solvent, an appropriate electrical resistance value of the solution is supposed to be 5,000 to 10,000 k$\Omega$. According to the above known methods, an appropriate polarization process is not possible because of the low voltage and electric field toward the material to be coated.

Moreover, according to the method and device of NANOPARTICLE SYNTHESIS WITH ELECTROSPRAY USING RECTANGULAR AC HIGH VOLTAGE, electricity leakage is easily caused when applying a high voltage, which makes it difficult to realize consistent production. In order to apply a high voltage stably to a material to be polarized in a mass-producing device, it is necessary to dispose a solution supply route and a high voltage apply route separately, causing the device to increase in size.

In the above three publications, there is also a limit in atomization of the solution.

In a method of forming a piezoelectric/pyroelectric film by spraying or dropping a dielectric solution, electric dipoles in the solution are oriented by electric field. Thereafter, it is necessary to allow the dielectric solution to be in a semi-cured state or a solidified state by quickly evaporating the solvent during the period from when the solution is sprayed until it adheres to the material to be polarized or after it adheres to the material to be polarized, in order to avoid the relaxation of the orientation.

In order to realize the above, it is a known method to generate an air stream of an inert gas to a direction different from a flow of a sprayed solution, so that the evaporation of the solvent is facilitated. An example of this method is MONOLITHIC PYROELECTRIC INFRARED IMAGE SENSOR USING PVDF THIN FILM (R&D Review of Toyota CRDL, Vol. 33, No 1, 1998.3).

According to this example, however, there is also a limit in atomization of the solution and a large unit is necessary to maintain an atmosphere formed by the gas by enclosing the entire device.

SUMMARY OF THE INVENTION

The present invention is made in view of the above-described problems, and its object is to provide a method and device for forming a piezoelectric/pyroelectric film, which can uniformize coating film thickness by atomizing a solution, perform electric field coating and electric field polarization of a three-dimensional material to be coated, and realize low-cost production without the need for a vacuum container, enclosed space and large facility.

In order to attain the above described object, the first aspect in accordance with the present invention provides a method for forming a piezoelectric/pyroelectric film on a material to be coated by electric field coating and electric field polarization, including the steps of:

forming an electric field between the material to be coated and a coating sprayer by applying a high voltage of −1 kV to −90 kV to an electrode needle at a tip of the coating sprayer facing a coating surface of the material to be coated, while maintaining the material to be coated positively (grounded state);

forming a precursor polarization film on the material to be coated by spraying an inert gas from an inert gas spraying nozzle at the tip of the coating sprayer to the material to be coated, simultaneously spraying a solution with a dielectric substance dissolved in a solvent (dielectric solution) to the material to be coated from a dielectric solution spraying nozzle at the tip of the coating sprayer, the dielectric solution spraying nozzle having the electrode needle at its center, and giving negative charge to droplets of the dielectric solution, while moving the coating sprayer;

discharging all of the dielectric solution remained in the dielectric solution spraying nozzle by temporarily stopping the electric field coating, moving the coating sprayer facing the material to be coated to face outside the material to be coated, and discharging the inert gas from the dielectric solution spraying nozzle of the coating sprayer; and forming a piezoelectric/pyroelectric film on the material to be coated by returning the coating sprayer to its original position, forming electric field between the material to be coated and the coating sprayer again, and further polarizing the precursor polarization film (electric field polarization).

According to the second aspect of the present invention, the method further includes the step of:

heating and drying the previously formed precursor polarization film and further performing the electric field polarization only, to form a piezoelectric/pyroelectric film on the material to be coated.

According to the third aspect of the present invention, the temperature of the material to be coated is controlled to be at least 20° C. and no more than 125° C.

The fourth aspect in accordance with the present invention provides a device for forming a piezoelectric/pyroelectric film on a material to be coated set in a receiving jig by electric field coating and electric field polarization, including:

the receiving jig;

a coating sprayer including an inert gas spraying nozzle, a dielectric solution spraying nozzle, and an electrode needle at a central portion of the nozzles disposed to face the material to be coated set in the receiving jig, the inert gas spraying nozzle being connected to an inert gas force-feeding tank through an inert gas flow channel, the dielectric solution spraying nozzle being connected to a dielectric solution force-feeding tank through a dielectric solution flow channel, the inert gas flow channel and the dielectric solution flow channel being connected through a bypass channel, and the electrode needle being connected to a high voltage power supply through a high voltage applying cable; and a control system controlling the steps of:

- forming an electric field between the electrode needle and the material to be coated by applying a high voltage to the electrode needle;
- forming a precursor polarization film on a surface of the material to be coated by simultaneously spraying an inert gas and a dielectric solution from the inert gas spraying nozzle and the dielectric solution spraying nozzle, respectively;
- discharging the solution remained in the dielectric solution spraying nozzle by moving the coating sprayer outside the material to be coated and supplying the inert gas to the dielectric solution spraying nozzle through the bypass channel; and
- performing the electric field polarization after moving the coating sprayer to face the material to be coated again.

It is possible to reduce the size of the device for forming the piezoelectric/pyroelectric film according to this aspect of the present invention.

According to the fifth aspect of the present invention, the coating sprayer is attached to a handling device having a joint with two or more axes.

It is possible to perform three-dimensional coating according to this aspect of the present invention.

According to the sixth aspect of the present invention, a heater for heating the set material to be coated is provided in the receiving jig for setting and mounting the material to be coated.

Conventionally, only small-sized and planar-shaped materials could be polarized in forming the piezoelectric/pyroelectric film. According to the first to fifth aspects of the present invention, however, large-sized and free-shaped materials to be coated may be subjected to the dielectric substance film forming and polarization in the atmosphere at the same time. Thus, it is possible to remove restrictions of the shape and dimension of the piezoelectric/pyroelectric film. It is also possible to substantially reduce the number of processes for forming the piezoelectric/pyroelectric film.

Further, since it uses the simple coating sprayer and does not require an expensive and large-scaled unit, it is able to cover a wide range of industrial applications.

According to the present invention, it is possible to form high-quality piezoelectric/pyroelectric films by forming the precursor polarization film and thereafter performing the electric field polarization again.

Further, upon spraying the solution, the solution is accelerated by the sprayed inert gas, and is atomized by means of the spraying energy of the inert gas. Thus, the uniform coating film can be attained.

Moreover, after the precursor polarization film is formed, the sprayer is temporarily moved outside the material to be coated and the inert gas is supplied to the solution spraying nozzle. Thus, the solution remained in the nozzle is removed and then the next polarization is performed. This improves the performance of the polarization.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

A method for forming a piezoelectric/pyroelectric film according to the present invention has the following processes.

a. In electric field coating and electric field polarization for forming a piezoelectric/pyroelectric film on a material to be coated, electric field is formed/maintained between the material to be coated and a coating sprayer by applying a high voltage of −1 kV to −90 kV to an electrode needle at a tip of the coating sprayer, while maintaining the material to be coated positively (grounded state). Next, a precursor polarization film is formed on the material to be coated by spraying an inert gas from an inert gas spraying nozzle of the coating sprayer to the material to be coated, simultaneously spraying a solution with a dielectric substance dissolved in a solvent from a dielectric solution spraying nozzle, and giving negative charge to droplets of the dielectric solution, while moving the coating sprayer, that is attached to the coating sprayer and facing the material to be coated, and atomizing and spraying the solution.

Then, all of the dielectric solution remained in the dielectric solution spraying nozzle is discharged by temporarily stopping the electric field coating, moving the coating sprayer facing the material to be coated to face outside the material to be coated, and injecting the inert gas in the dielectric solution spraying nozzle of the coating sprayer. Next, a piezoelectric/pyroelectric film is formed on the material to be coated by forming/maintaining electric field only between the material to be coated and the coating sprayer again, and further polarizing the precursor polarization film.

b. In the electric field coating and electric field polarization according to a., the polarization film, that is formed by the electric field coating and electric field polarization, is dried by thermal energy and subjected to the electric field polarization only, to form the piezoelectric/pyroelectric film on the material to be coated.

c. In the electric field coating and electric field polarization according to a., the temperature of the material to be coated is controlled to be at least 20° C. and no more than 125° C., to form the piezoelectric/pyroelectric film on the material to be coated.

The method for forming the piezoelectric/pyroelectric film according to the present invention includes the process of forming the coating film using the electric field. In general, a dielectric film formed by an organic solution casting method (for example, polyvinylidene fluoride (PVDF)) has α-type crystal structures which do not exhibit piezoelectricity/pyroelectricity. It is known that, when the dielectric film is subjected to a stretching process, the α-type crystal structure shifts to a β-type crystal structure exhibiting the piezoelectricity/pyroelectricity, and by applying a high voltage after that, the integrated β-type crystals are oriented, exhibiting better piezoelectricity/pyroelectricity.

In the precursor polarization film which is formed by the electric field coating on the material to be coated by the process a. of the present invention, the negatively-charged dielectric substance is sprayed so that the solvent contained in the dielectric solution is evaporated, and at the same time, the α-type crystal structures adhere to the material to be coated while being polarized by the action of the electric field. Thus, electric dipoles of molecular chains of the dielectric substance form the β-type crystal structures.

After that, only the electric field is formed/maintained between the material to be coated and the coating sprayer, and the β-type crystal structures in the precursor polarization film are oriented along the direction of the electric field (the directions of the β-type crystal structures are arranged to the same direction). By applying the electric field only after the electric field coating, the precursor polarization film becomes a polarization film with facilitated polarization, exhibiting better piezoelectricity/pyroelectricity.

In the electric field coating according to the process a., the dielectric solution is atomized by spraying the inert gas to the material to be coated and simultaneously discharging the dielectric solution. This facilitates the evaporation of the solvent included in the dielectric solution, and increases the electric field on each droplet particle because the dielectric solution is finely divided by the atomization. Thus, the dielectric solution is atomized by using the inert gas, so that the electric field intensity on the droplet particle is increased and the orientation of the electric dipoles of the molecular chains of the dielectric substance is facilitated.

The process a. is suitable for the dielectric solution having low electric resistance value (0 to 200 kΩ). After the electric field coating, the coating sprayer facing the material to be coated is moved to face outside the material to be coated, and all the dielectric solution remained in the dielectric solution spraying nozzle is discharged by supplying the inert gas into the route of the dielectric solution nozzle. Thus, the leakage of a high electric current through the solution remained in the nozzle to the solution tank is prevented. Also, the high voltage and electric field are formed without fail to the material to be coated. As a result, the efficient polarization process is made possible.

According to the process b., the polarization film, which is formed on the material to be coated by the electric field coating and the electric field polarization by the process a., is dried by supplying thermal energy and further subjected to the electric field polarization only. Thus, it is possible to obtain the polarization film with its polarization further facilitated than that of the process a., and exhibiting better piezoelectricity/pyroelectricity.

According to the process c., the temperature of the material to be coated is controlled to be at least 20° C. and no more than 125° C. Thus, the molecular chains of the dielectric solution are brought into an easily movable state. By controlling the temperature of the material to be coated to become the most suitable temperature for the movement according to the type of the dielectric substance, it is possible to perform the polarization process stably and efficiently.

It is preferable that the temperature of the material to be coated be practically in the range of 20° C. to 125° C., because the polarization is facilitated within this temperature range when forming the precursor polarization film. It is not favorable that the temperature is less than 20° C. because the formation of the polarization film becomes unstable, and that the temperature is more than 125° C. because cracks and fine holes are caused in the polarization film.

The material to be coated may be any one of organic polymer, inorganic metal, and the mixture thereof. The inorganic metal is preferable. When coating the organic polymer material, it is preferable to adhere/coat a conductive metal electrode in advance to the spot to give the piezoelectricity/pyroelectricity and ground it, in order to increase the electric field intensity.

The shape of the material to be coated may be a planar shape, R-shape, odd shape, cylindrical shape, conical shape, free shape and so on.

As the dielectric substance, it is suitable to use a copolymer (P(VDF-TrFE)) of organic polyvinylidene fluoride (PVDF), vinylidene fluoride (VDF) and trifluoroethylene (TrFE), or a blend of soluble substances such as polyamide (PA), polyethylene (PE), polyethylene terephthalate (PET, PETE), polyvinyl chloride (PVC), polyvinylidene chloride (PVDC), polylactic acid (PLA), polypropylene (PP), polycarbonate (PC), polytetrafluoroethylene (PTFE), polyurethane (PU), polystyrene (PS), polyester, ABS resin (ABS), acrylic resin (PMMA), polyacetal resin (POM) and so on.

As the dielectric substance, it is also suitable to use ceramic particles such as inorganic barium titanate, calcium titanate, strontium titanate or lead zirconate titanate.

It is also suitable to use a blend of the organic substance and the inorganic substance as the dielectric substance.

As the solvent for the dielectric solution, it is suitable to use either one or a blend of two or more of ethanol, polyethyleneglycol, N,N-dimethylformamide (DMF), N-methyl-2-pyrrolidone (NMP), propylene carbonate, ethylene carbonate, gamma-butyrolactone, dimethylacetamide, acetone, methyl ethyl ketone (MEK), ethyl acetate, butyl acetate, tetrahydrofuran (THF), cyclohexane, furfural, hexamethylphosphoric triamide (HMPA) and so on.

A mixture ratio of the dielectric substance and the solvent is preferably 1:99 to 20:80 for the practical purposes. If the percentage of the dielectric substance is greater than this, various failures including lowering of the applied voltage during the electric field coating are caused and stable electric field coating is not possible, because an increase in viscosity of the dielectric solution causes the difficulty in discharging the solution from the dielectric solution nozzle and atomizing the discharged droplets.

In order to quickly and efficiently perform the polarization process of the present invention, an evaporation rate of the solvent used in the dielectric solution is the quite important factor, together with the conditions such as the supplied voltage and moving speed of the coating sprayer. When the polarization process is compared between the case where the coating film is in a state of the solution with less evaporation of solvent and the case where the coating film is in a semi-cured state (gel state) with the solvent evaporated quickly, it is easier for the semi-cured coating film to maintain the orientation of the electric dipoles of the dielectric substance in the direction of the electric field. Thus, it is preferable to use the solvent with a high evaporation rate for the solvent of the dielectric solution.

The semi-cured state according to this invention is made by polymers, which are insoluble in the solvent and have three-dimensional network structures, and swelled bodies thereof. In the semi-cured state, a ratio of the solvent in the coating film is within the range of 1 to 50%. When the ratio is 50% or more, it is not in the semi-cured state (solution). According to the present invention, the solvent means an organic solvent for dissolving the dielectric substance when forming the coating film.

It is preferable that the solvent of the dielectric solution includes acetone with a low boiling point (56° C.) and high evaporation rate.

The content of acetone in the solvent is within the range of 1 to 50% by weight. In this range, the evaporation of the solvent is accelerated during the electric field coating and electric field polarization. Hence, failures including dust depositions can be reduced, and production efficiency can be improved because of the reduced drying time. If the content of acetone is greater than this, the solvent evaporates too quickly. The solution is solidified while it is being sprayed from the dielectric solution spraying nozzle toward the material to be coated, which makes it difficult for the solution to adhere to the material to be coated.

When the content of acetone in the solvent is within the range 1 to 50% by weight, the electric resistance value is from 100 k$\Omega$ to 300 k$\Omega$ and a high voltage can be applied stably. Thus, crystal growth and orientation of $\beta$ crystals of the dielectric substance are facilitated so that the polarization film with better polarization and piezoelectricity/pyroelectricity can be obtained.

It should be noted that the dielectric solution is formed by being stirred and mixed under room temperature.

The precursor polarization film according to this invention means the polarization film before the electric field polarization. More particularly, it is the film formed by the following process: in the electric field coating, the dielectric solution having the dielectric substance negatively charged is sprayed and vaporized; the solvent in the dielectric solution is volatilized; at the same time the $\alpha$-type crystal structures adhere onto the material to be coated while being polarized by the action of the electric field; and the electric dipoles of the molecular chains of the dielectric substance form the $\beta$-type crystal structures. After the electric field polarization, the film is referred to as the coating film for distinction.

The temperature for drying the polarization film obtained by the electric field coating and electric field polarization processes may not be limited as long as the temperature is less than the crystallization temperature of the dielectric substance and the solvent can be entirely removed. The film may be heated by hot air, halogen lamp, far infrared heater or the like. Drying time is not limited and can be decided according to the drying method and the drying temperature, as long as the solvent is evaporated and the polarization film is solidified.

The inert gas sprayed from the inert gas spraying nozzle may be nonflammable and chemically inactive carbon dioxide, argon, helium, nitrogen, oxygen and the like.

The method for forming the piezoelectric/pyroelectric film according to this invention includes the process of feeding a DC voltage of −1 kV to −90 kV to the electrode needle at the tip of the coating sprayer. Supplying the high voltage to the electrode needle on the coating sprayer and forming the electric field between the positively-charged material to be coated mean that the polarization process is performed according to the present invention.

The polarization process is performed in order to allow the electric dipoles of the molecular chains of the dielectric substance and its α-type crystal structures to be shifted to the β-type crystal structures, or to be oriented to one direction. By this process, the precursor polarization film and the polarization film exhibit the piezoelectricity/pyroelectricity. Any known electrode processing may be used after the polarization process. For example, a sputtering method, a vapor deposition method, a paste coating method, a silk printing method, a pad printing method or the like may be used to form highly conductive metal electrode on either surface or both surfaces of the film.

The voltage suitable for the thickness of the film to be formed is supplied. When the film thickness is 5 to 100 mm, the DC voltage exceeding 1 kV, preferably 10 kV or more, and more preferably 30 kV to 90 kV, may be supplied.

When the voltage is within the above range, the polarization process can be performed efficiently. When the voltage is less than 1 kV, the efficient polarization process is not possible and the film with the excellent piezoelectricity/pyroelectricity cannot be obtained. It should be noted that the time for forming/maintaining the electric field between the coating sprayer and the material to be coated is not limited. Usually it is one second or more and preferably, 10 seconds or more and 3,600 seconds or less. Longer polarization of the precursor polarization film and the polarization film improves the degree of polarization.

In the electric field coating, the pressure of the inert gas supplied through the inert gas spraying nozzle is favorably in the range of 0.01 to 0.3 MPa. When the pressure is more than 0.3 MPa, the inert gas is easily rebounded from the material to be coated and the degree of adhesion of the atomized and sprayed dielectric solution to the material to be coated deteriorates significantly. In addition, the dielectric solution is splashed to the surroundings and adhered to the coating sprayer and the like, and the solidified dielectric substance is separated and freed to adhere to the material to be coated. The malfunction is thus caused and is not favorable.

The moving speed of the coating sprayer with respect to the material to be coated is favorably within the range of 1 to 300 mm/sec. When the speed is more than 300 mm/sec, the electric field intensity is decreased and the efficient polarization process is not possible.

In order to move the coating sprayer, it is favorable to use a handling device having a joint with at least two to six axes which can control/maintain sliding and rotation of the tip of the coating sprayer in multiple directions. Industrial multi-axial robots are one of the examples.

The formation of the precursor polarization film and the next electric field polarization may be performed while the material to be coated being moved alone or together with the movement of the coating sprayer.

In discharging the dielectric solution remained in the dielectric solution spraying nozzle after the electric field coating, the coating sprayer facing the material to be coated is moved to the position to face outside the material to be coated. The distance of this movement is not limited, as long as the dielectric substance, which is discharged, splashed and solidified, does not adhere to the precursor polarization film. It is effective to provide a suction device for the discharged solution.

The distance between the electrode needle attached to the coating sprayer and the material to be coated may be 50 mm or more and 200 mm or less and, more preferably, 100 mm or less. When the distance is 50 mm or less, sparks are easily caused between the coating sprayer and the material to be coated. This should be avoided because the sparks leave holes in the coating film, and also cause fire by igniting the solution. Also, it is not favorable to separate the coating sprayer and the material to be coated by 200 mm or more, because the electric field intensity decreases and the efficient polarization process is not possible.

The polarization film formed as above exhibits the piezoelectricity/pyroelectricity. According to the present invention, the piezoelectric/pyroelectric film means the film having the electric dipoles of the dielectric substance being oriented in the same direction and exhibiting the piezoelectricity/pyroelectricity.

The piezoelectricity/pyroelectricity of the film can be checked by the voltage waveform of the external stress applied to the film such as bending, compression and tension, and the strain caused by the external stress. When the film has the piezoelectricity/pyroelectricity, a positive or negative voltage is obtained in response to the external stress, and the inverse voltage is obtained when the strain is relaxed.

It is possible to apply the piezoelectric/pyroelectric film of the present invention to electronics materials such as piezoelectric elements, actuators for micro-and nano-machines and speakers, and medical parts such as pacemakers, sensors for robots and the like.

The final thickness of the piezoelectric/pyroelectric film of the present invention can be decided according to the purposes. Usually it is 1 to 100 μmm and preferably within the range of 3 to 10 μmm. The film thickness exceeding 100 μmm lacks in practicality because the electric field needs to be formed for a longer time and with a higher voltage in the polarization process.

Hereinafter, embodiments and a comparative example of the present invention will be explained. It should be noted that the present invention is not limited to these embodiments and may be a combination thereof.

An example of a device for forming a piezoelectric/pyroelectric film will be explained with reference to FIG. 1.

Figure 1:
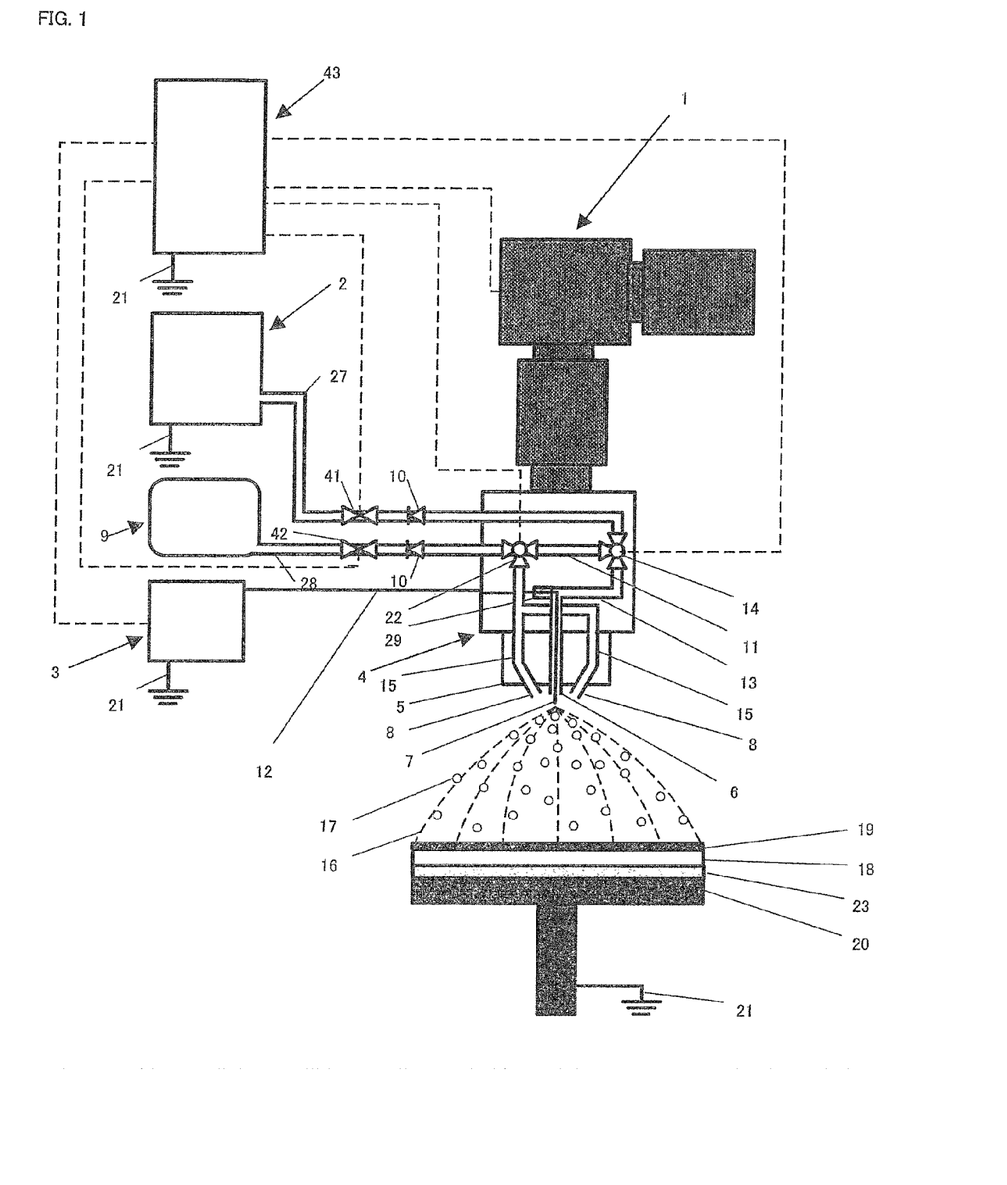
FIG. 1 is an explanatory view illustrating a forming device and a coating method according to the present invention.

In FIG. 1, a handling device 1 has a coating sprayer 4 attached at a tip thereof. The handling device 1 adjusts a distance between the coating sprayer 4 and a material to be coated 18, performs reciprocal motion therebetween, and moves the coating sprayer 4 from the material to be coated 18.

The coating sprayer 4 is provided with a dielectric solution spraying nozzle 6 for coating, with an electrode needle 7 being inserted in its center, and inert gas spraying nozzles 8 at both sides of the dielectric solution spraying nozzle 6.

The dielectric solution spraying nozzle 6 is connected to a solution force-feeding tank 2 through a solution carrying flow passage 27 which has an ON/OFF valve 41, a check valve 10 and a three-way solenoid valve 14. The dielectric solution spraying nozzle 6 can spray a solution for coating to the material to be coated 18 set in a receiving jig 20.

Both of the two inert gas spraying nozzles 8 are respectively connected to an inert gas force-feeding tank 9 through a branch flow passage 15 and an inert gas carrying flow passage 28 which has an ON/OFF valve 42, a check valve 10 and a three-way solenoid valve 22. The inert gas spraying nozzles 8 can spray an inert gas to the material to be coated 18.

A bypass flow passage 11 connects the solution carrying flow passage 27 and the inert gas carrying flow passage 28 using the three-way solenoid valves 14 and 22. By switching the three-way solenoid valves 14 and 22, the inert gas is bypassed and discharged from the bypass flow passage 11 to the dielectric solution spraying nozzle 6. Thus the solution remained in the dielectric solution spraying nozzle 6 can be discharged when forming a precursor polarization film.

A high voltage power supply 3 can supply a high voltage to the electrode needle 7 through a high voltage cable 12 via an insulating socket 29.

A heater 23 controls the temperature of the material to be coated 18 set in the receiving jig 20 to be within the range from 20° C. to 120° C. A coating film 19 is formed on the surface of the material to be coated 18, and earthing 21 is provided.

Next, the operation of the above-described device will be explained.

First, the material to be coated 18 is set in the receiving jig 20 and heated by the heater 23 to a predetermined temperature. The electrode needle 7, which is attached to the coating sprayer 4, is supplied with a high voltage from the high voltage power supply 3, and faced to the material to be coated 18, which is connected to the earthing 21. Thus, the material to be coated 18 is positively charged, and electric field 16 is formed between the electrode needle 7 and the material to be coated 18.

After forming the electric field 16, the solution is sprayed from the dielectric solution spraying nozzle 6 and at the same time, the inert gas is sprayed from the inert gas spraying nozzle 8, along the direction of the electric field. Thus, negatively charged droplet particles 17 are attached to the material to be coated 18, and a precursor polarization film 19 is formed.

After the precursor polarization film 19 is formed, the coating sprayer 4 is moved to face outside the material to be coated 18. Then, the inert gas, which is sent from the inert gas force-feeding tank 9 through the inert gas carrying flow passage 28 and the bypass flow passage 11, is discharged from the dielectric solution spraying nozzle 6, so that the solution remained in the nozzle 11 is discharged. Thereafter, the polarization is performed again.

Figure 2:
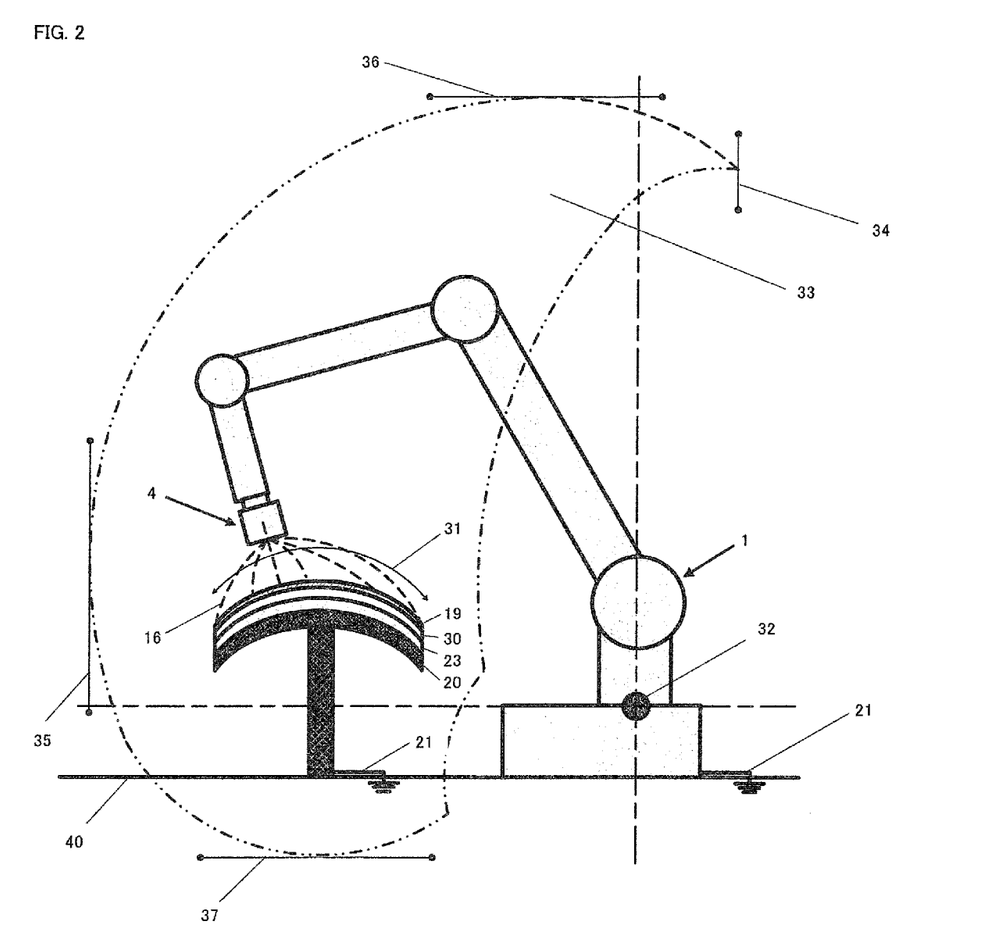
FIG. 2 is a side view illustrating an R-shaped material to be coated and its coating method.
Figure 3:
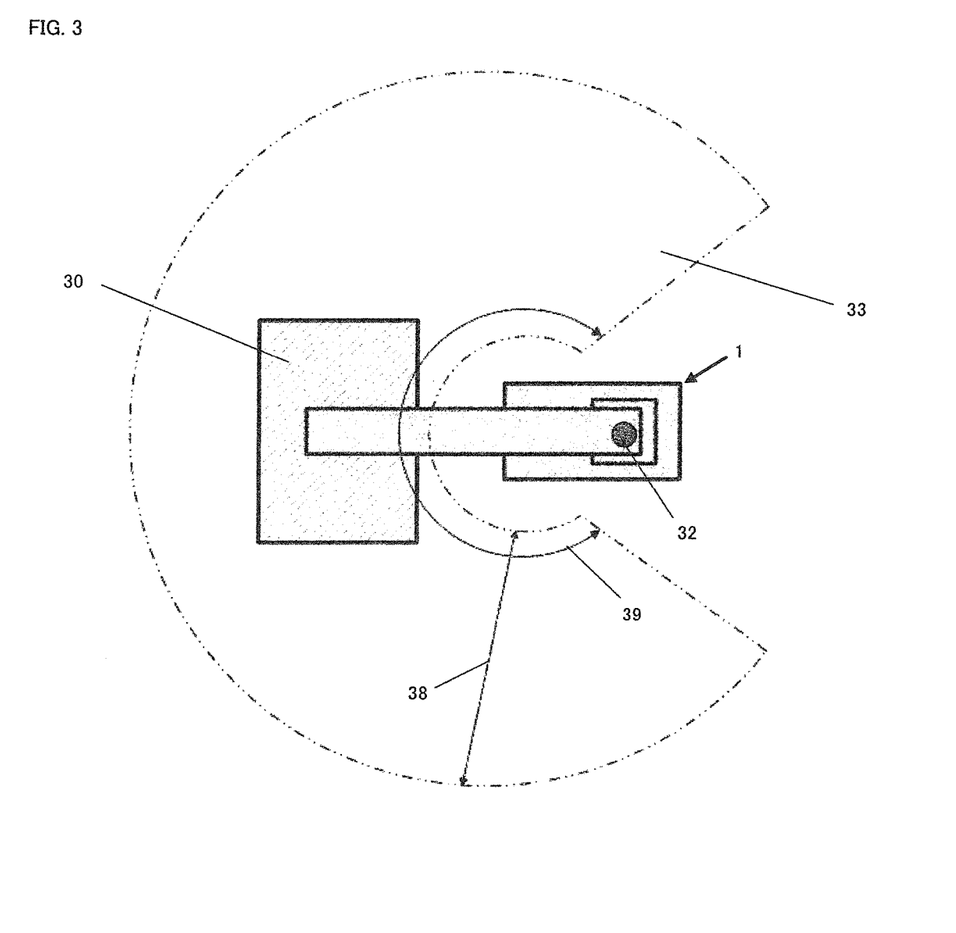
FIG. 3 is a top view illustrating the R-shaped material to be coated and its coating method.

FIG. 2 is a side view and FIG. 3 is a top view illustrating a material to be coated in a convex shape, and a method for coating the same.

First, an operation range of the handling device 1 is explained with reference to FIG. 2, illustrating a 6-axis control handling robot (PX2850) manufactured by Yasukawa Electric Corporation as an example.

The handling device 1, which can control/maintain sliding and rotation of the coating sprayer 4 in multiple directions within a coating sprayer operable range 33, and the receiving jig 20 are disposed on a floor 40. The heater 23 and a semi-cylindrical material to be coated 30 are mounted on the receiving jig 20.

The operable range 33 of the coating sprayer, which is attached to the handling device 1, is from a handling device center point 32 to a backward operation limit line 34 of the coating sprayer, a forward operation limit line 35 of the coating sprayer, an upward operation limit line 36 of the coating sprayer, and a downward operation limit line 37 of the coating sprayer. The operable range is in an elliptical shape. Locus of the movement 31 shows how the coating sprayer moves along the semi-cylindrical material to be coated 30.

The distance from the handling device center point 32 to the backward operation limit line 34 of the coating sprayer is 1,600 mm, the distance to the forward operation limit line 35 of the coating sprayer is 2,900 mm, the distance to the upward operation limit line 36 of the coating sprayer is 3,000 mm, and the distance to the downward operation limit line 37 of the coating sprayer is 1,000 mm. Electric field coating and electric field polarization of the present invention are possible as long as the material to be coated is disposed within this operable range.

Next, the operable range of the handling device 1 will be explained with reference to FIG. 3.

The operable range 33 of the coating sprayer attached to the handling device 1 has a rotatable angle 39, which is 300 degrees in an arc shape with the handling device center point 32 at its center. A rotation operable range 38 is 2,900 mm. Electric field coating and electric field polarization of the present invention are possible as long as the material to be coated is disposed within this operable range.

By storing programs for moving speeds, numbers of reciprocations, loci of movements and so on in advance in a memory system (not shown) in the handling device 1, it is possible for the handling device 1 to automatically and repeatedly move/rotate the tip of the coating sprayer 4 according to the programs along the shape of the semi-cylindrical material to be coated 30 while keeping a constant clearance therebetween.

The flow of the first and second aspects of the present invention will be explained in detail with reference to FIG. 4 and FIG. 5.

Figure 4:
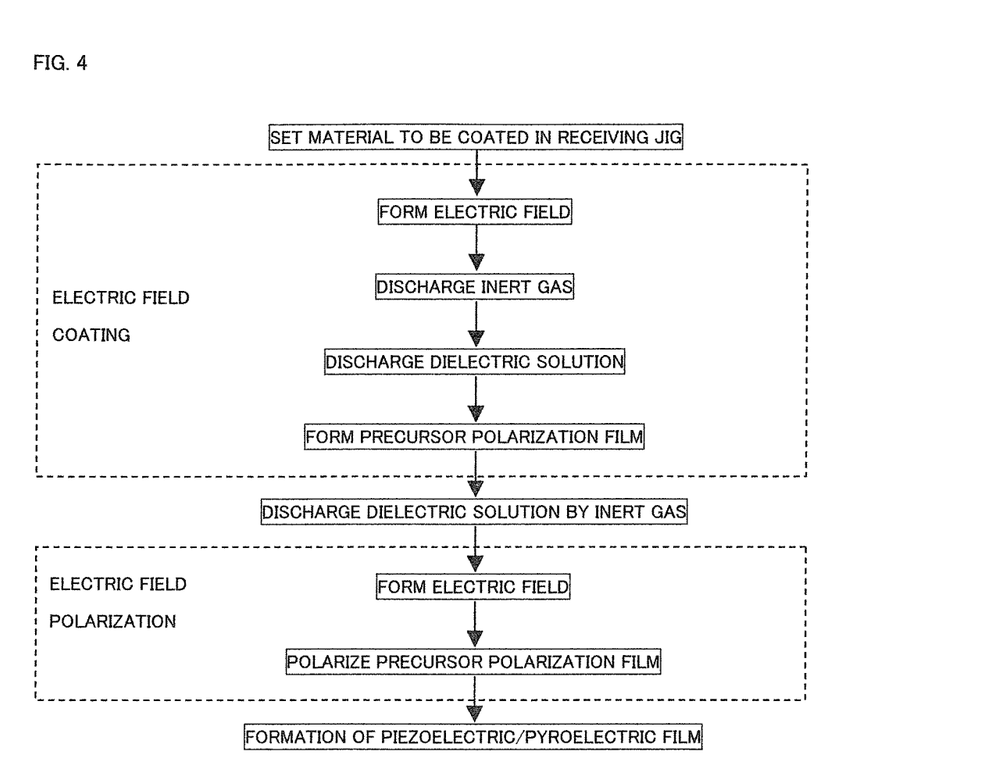
FIG. 4 is a flowchart according to the first aspect of the present invention.

FIG. 4 is a flowchart of the first aspect of the present invention. First, the electric field is formed from the electrode needle 7 attached to the coating sprayer 4 toward the material to be coated 18. Then, the inert gas is sprayed from the inert gas spraying nozzle 8 of the coating sprayer 4 to the material to be coated 18, and at the same time, the dielectric solution is sprayed from the dielectric solution spraying nozzle 6 of the coating sprayer 4. Thus, the solution is atomized/sprayed and the precursor polarization film is formed on the material to be coated 18. The above process is referred to as the electric field coating.

Next, all of the dielectric solution remained in the dielectric solution spraying nozzle 6 is discharged by temporarily stopping the electric field coating, moving the coating sprayer 4 facing the material to be coated 18 to face outside the material to be coated 18, and injecting the inert gas to the dielectric solution spraying nozzle 6 of the coating sprayer 4. Finally, the electric field is formed again between the material to be coated 18 and the coating sprayer 4, and the precursor polarization film is further polarized. This final process is referred to as the electric field polarization.

Figure 5:
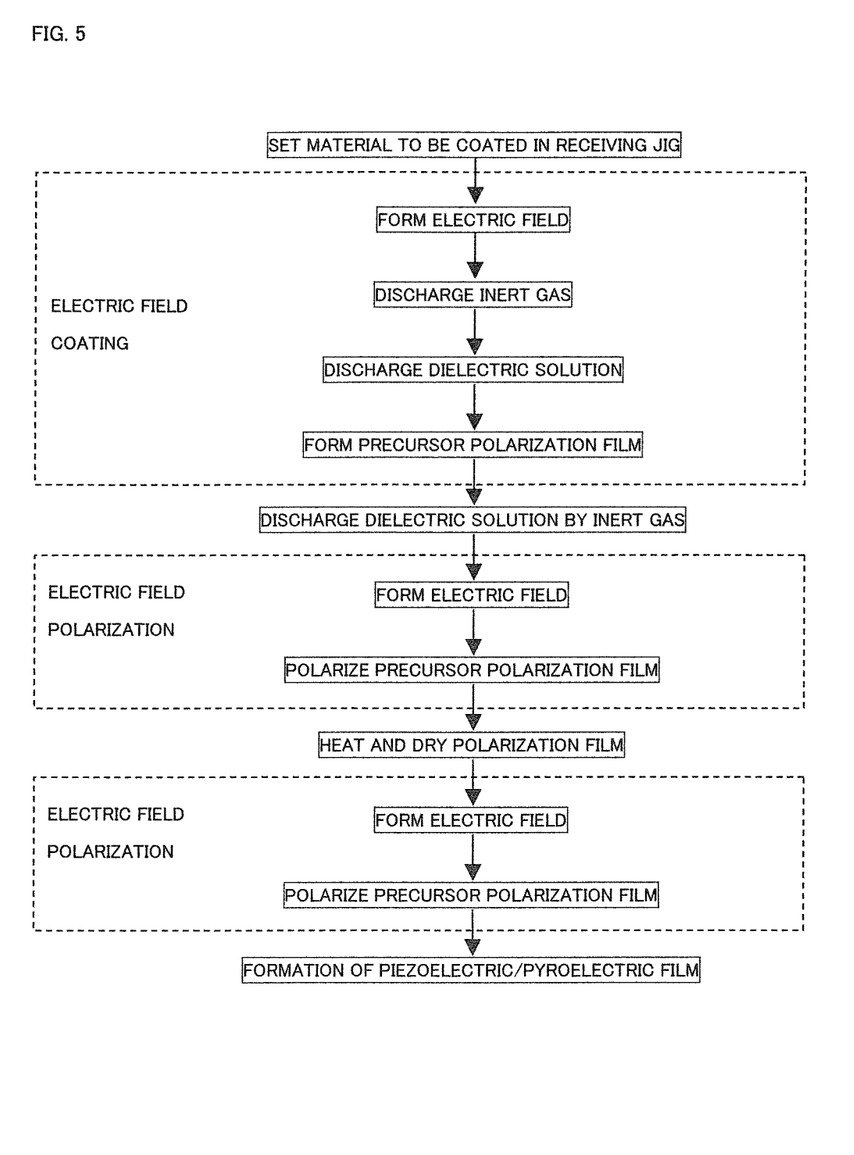
FIG. 5 is a flowchart according to the second aspect of the present invention.

FIG. 5 is a flowchart of the second aspect of the present invention, which has the process of heating and drying the polarization film formed according to the first aspect of the present invention. Then the electric field is formed again between the material to be coated 18 and the coating sprayer 4, followed by the electric field polarization process in which the polarization film is further polarized.

Now, a first embodiment of the present invention will be explained.

PVDF (#850 manufactured by Kureha Corporation) and DMF (manufactured by Yamaichi Chemical Industries Co., Ltd.) are employed as a dielectric substance and a solvent, respectively. A dielectric solution is diluted at a mixing ratio of 4:96. An electric resistance value of the solution is 100 kΩ at this time. A material to be coated 18 is a copper plate with its length 100 mm, width 40 mm and thickness 0.8 mm (hereinafter referred to as the material to be coated 18).

A coating sprayer 4 (manufactured by Munekata Co., Ltd.) is attached to a handling device 1, which is a handling robot (PX2850) manufactured by Yasukawa Electric Corporation. A center point of the coating sprayer 4 is aligned to a center point in width of the material to be coated 18. Then the coating sprayer 4 is moved along a longitudinal direction of the material to be coated 18.

An operable range corresponds to the length of the material to be coated 18. A moving speed is set to 100 mm/sec, a voltage supplied to an electrode needle 7 is 60,000 V, a discharge pressure of the solution is 0.03 MPa, and a spraying pressure of an inert gas is 0.2 MPa. Under these conditions, the material to be coated 18 is subjected to electric field coating for 10 seconds (five reciprocations). Then the coating sprayer 4 facing the material to be coated 18 is moved to the position outside the material to be coated 18 by 200 mm, and a dielectric solution in a dielectric solution spraying nozzle 6 is discharged for five seconds by the inert gas. At this time, the thickness of a precursor polarization film is 3 μm.

Next, a coating film 19 is subjected to electric field polarization for 30 seconds (15 reciprocations).

Piezoelectric values are compared between the cases where the distances between the electrode needle 7 attached to the coating sprayer 4 and the material to be coated 18 are 50, 100 and 200 mm, respectively, while warming and maintaining the temperature of the material to be coated 18 to be 70° C. by a heater 24. The piezoelectric values of the obtained coating films 19 are about 1,000 mV, 700 mV and 300 mV when the distances are 50 mm, 100 mm and 200 mm, respectively.

Figure 7:
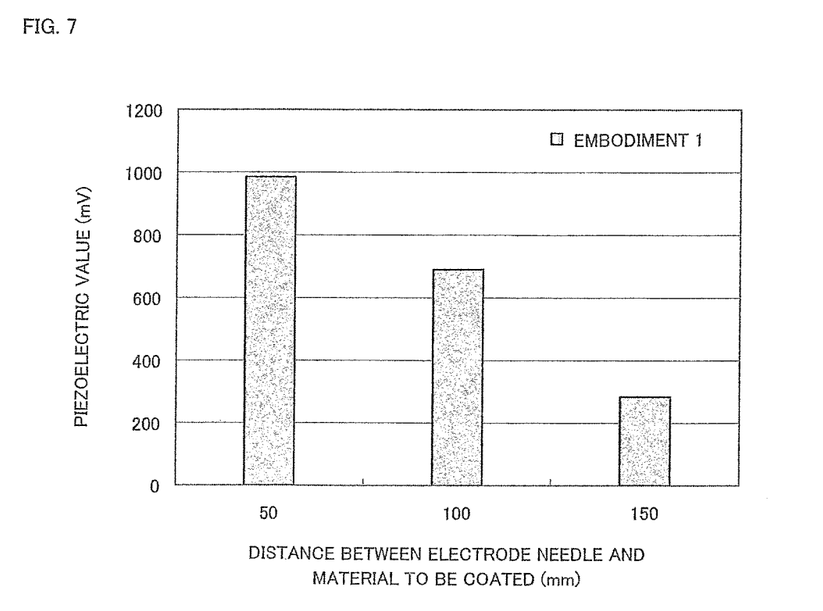
FIG. 7 is a graph depicting measurement results of piezoelectric values according to a first embodiment.
Figure 8:
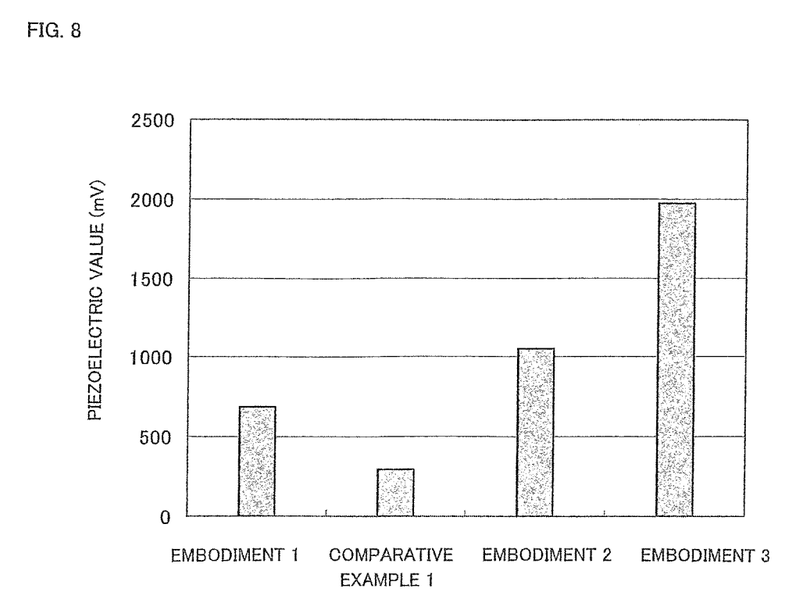
FIG. 8 is a graph illustrating measurement results of piezoelectric values according to first, second and third embodiments and a comparative example 1.

The piezoelectric value increases as the distance between the electrode needle 7 attached to the coating sprayer 4 and the material to be coated 18 decreases, and therefore it is identified that there is an inverse relationship between electric field intensity and the distance between the electrode needle 7 of the coating sprayer 4 and the material to be coated 18. The results are presented in Table 1, FIG. 7 and FIG. 8.

dielectric solution spraying nozzle 6 at the time of electric field polarization, an electric current leaks through a solution carrying flow passage, and hence electric field intensity toward a material to be coated decreases. In order to confirm the effect of discharging the remained solution, the electric field polarization is performed without discharging the solution in the dielectric solution spraying nozzle 6, by using a solution identical to the one used in the first embodiment. The distance between an electrode needle 7 attached to a coating sprayer 4 and a material to be coated 18 is set to be 100 mm, and the rest of the conditions are identical to the first embodiment. A piezoelectric value of thus-obtained coating film 19 is about 300 mV.

The comparison with the first embodiment shows that the piezoelectric value is reduced by half, which nearly corresponds to the value after electric field coating with 200 mm distance between the electrode needle 7 and the material to be coated 18. It is identified that, when the dielectric solution having the low electric resistance value is used in the electric field polarization, the electric current leaks through the solution carrying flow passage and the electric field intensity toward the material to be coated decreases, and that the discharging of the solution is effective as the countermeasure. The results are represented in Table 1 and FIG. 8.

TABLE 1

|  | Embodiment 1 | | | Embodiment 2 | Embodiment 3 | Comparative Example 1 |
|---|---|---|---|---|---|---|
| Voltage (V) | | | | 60,000 | | |
| Time for electric field coating (s) | | | | 10 | | |
| Time for electric field polarization (s) | | | | 30 | | |
| Time for discharging solution (s) | | | | 5 | | 0 |
| Distance between coating gun and material to be coated (mm) | 50 | 100 | 200 | | 100 | |
| Film thickness (μm) | | | | 3 | | |
| Hot air drying | | | | | 80° C. 60 minutes | |
| Dielectric substance | | | | PVDF | | |
| Solvent | | DMF | | Acetone/DMF | | DMF |
| Solution mixing ratio | | | | 4:96 | | |
| Solvent mixing ratio | | | | 30:50 | | |
| Electric resistance value (MΩ) | | 0.1 | | 0.3 | | 0.1 |
| Piezoelectric value (mV) | 987 | 688 | 285 | 1050 | 1967 | 295 |

Figure 6:
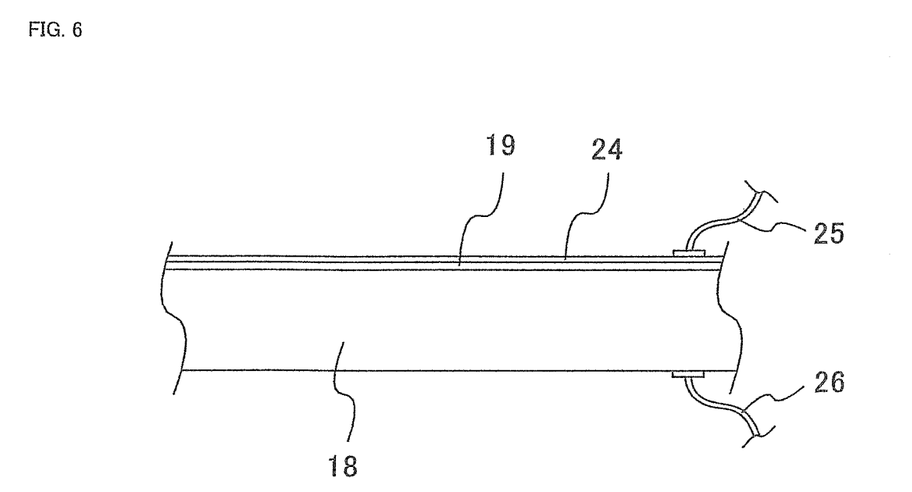
FIG. 6 is an explanatory view illustrating the material to be coated and a piezoelectric/pyroelectric film.

When measuring the piezoelectric values, a silver paste is applied to the top surface of the coating film 19, while the coating film 19 and the material to be coated 18 are closely attached, to form a film electrode 24. Then lead wires 25, 26 are connected to the material to be coated 18 and the film electrode 24. A measuring sample is illustrated in FIG. 6. The measuring sample is clamped at both lengthwise ends by a tensile tester (manufactured by Munekata Co., Ltd), and repeatedly expanded and contracted for 30 times/min. with a strain amount of 0 to 0.5% uniaxially. The piezoelectric value mV (maximum value) between the material to be coated 18 and the film electrode 24 is measured by an oscilloscope (NR-350 manufactured by Keyence Corporation).

Next, a comparative example 1 will be explained.

According to the first embodiment, when the dielectric solution with a low electric resistance value remains in a In the comparative example 1, the piezoelectric values are measured according to the measurement method described in the first embodiment.

Next, a second embodiment will be explained.

PVDF and acetone/DMF are employed as a dielectric substance and a solvent for mixture, respectively, in order to identify the effect of a dielectric solution having better evaporativity than DMF alone as in the first embodiment. A mixing ratio of acetone and DMF is 30:50, which is regarded optimum from examination results, and a mixing ratio of PVDF and the solvent is 4:96. An electric resistance value of the dielectric solution is 300 kΩ at this time.

The distance between an electrode needle 7 attached to a coating sprayer 4 and a material to be coated 18 is set to be 100 mm, and the rest of the conditions are identical to the first embodiment.

A piezoelectric value of thus-obtained coating film 19 is about 1,000 mV, which is about 1.5 times higher than that of the first embodiment. Since acetone having higher evaporativity is mixed in the used solvent, electric dipoles are oriented while a dielectric solution is being sprayed from the coating sprayer to the material to be coated to form a semi-cured coating film on the material to be coated. Thus, the orientation of the electric dipoles is maintained without relaxation, and hence strong orientational polarization is obtained. It is possible to identify from these results that the piezoelectric values increase as the evaporativity of the dielectric solution increases. The results are represented in Table 1 and FIG. 8.

In the second embodiment, the piezoelectric values are measured according to the measurement method described in the first embodiment.

Next, a third embodiment corresponding to a second aspect of the present invention will be explained.

The effect of drying and heating a coating film, which is formed by electric field coating and electric field polarization, and further performing electric field polarization is confirmed. The distance between an electrode needle 7 attached to a coating sprayer 4 and a material to be coated 18 is set to be 100 mm, and the rest of the conditions are identical to the first embodiment. The heating and drying are performed by hot air at a temperature of 80° C. for 60 minutes, which is regarded optimum from examination results.

Electric field polarization after the drying is performed for 30 seconds (15 reciprocations) with a supplying voltage of 60 kV. A piezoelectric value of thus-obtained coating film 19 is about 2,000 mV, which is about 2.8 times higher than that of the first embodiment. The coating film 19 of the first embodiment is further crystallized by the hot air drying, and the crystals are oriented by the electric field polarization, thus exhibiting the higher piezoelectricity than that of the first embodiment.

As a result of this, it is possible to identify that the piezoelectric values increase when the coating film 19, which is formed by the electric field coating and the electric field polarization according to the first embodiment, is heated and dried and further subjected to the electric field polarization. The results are represented in Table 1 and FIG. 8.

In the third embodiment, the piezoelectric values are measured according to the measurement method described in the first embodiment.

While specific embodiments of the invention have been shown and described in detail to illustrate the application of the principles of the invention, it will be understood that the invention may be embodied otherwise without departing from such principles.

What is claimed is:

1. A method for forming a piezoelectric/pyroelectric film on a material to be coated by an electric field coating and electric field polarization, the method comprising the steps of:

forming an electric field between the material to be coated and a coating sprayer by applying a high voltage of −1 kV to −90 kV to an electrode needle at a tip of the coating sprayer facing a coating surface of the material to be coated, while maintaining the material to be coated positively charged;

forming a precursor polarization film on the material to be coated by spraying an inert gas from an inert gas spraying nozzle at the tip of the coating sprayer onto the material to be coated, simultaneously spraying a solution with a dielectric substance dissolved in a solvent onto the material to be coated from a dielectric solution spraying nozzle at the tip of the coating sprayer, the dielectric solution spraying nozzle having the electrode needle at a center thereof, and giving negative charge to droplets of the dielectric solution, while moving the coating sprayer;

discharging all of the dielectric solution remaining in the dielectric solution spraying nozzle by temporarily stopping the electric field coating, moving the coating sprayer facing the material to be coated to face outside the material to be coated, and discharging the inert gas from the dielectric solution spraying nozzle of the coating sprayer; and forming a piezoelectric/pyroelectric film on the material to be coated by returning the coating sprayer to an original position, forming the electric field between the material to be coated and the coating sprayer again, and further polarizing the precursor polarization film.

2. A method for forming the piezoelectric/pyroelectric film on the material to be coated by the electric field coating and electric field polarization according to claim 1, further comprising the step of:

heating and drying the previously formed precursor polarization film and further performing the electric field polarization only, to form a piezoelectric/pyroelectric film on the material to be coated.

3. A method for forming the piezoelectric/pyroelectric film on the material to be coated by the electric field coating and electric field polarization according to claim 1, wherein the temperature of the material to be coated is controlled to be at least 20° C. and no more than 125° C.

4. A device for forming a piezoelectric/pyroelectric film on a material to be coated set in a receiving jig by an electric field coating and electric field polarization, comprising:

the receiving jig;

a coating sprayer including an inert gas spraying nozzle, a dielectric solution spraying nozzle, and an electrode needle at a central portion of the nozzles disposed to face the material to be coated set in the receiving jig, the inert gas spraying nozzle being connected to an inert gas force-feeding tank through an inert gas flow channel, the dielectric solution spraying nozzle being connected to a dielectric solution force-feeding tank through a dielectric solution flow channel, the inert gas flow channel and the dielectric solution flow channel being connected through a bypass channel, and the electrode needle being connected to a high voltage power supply through a high voltage applying cable; and a control system configured to control:

forming an electric field between the electrode needle and the material to be coated by applying a high voltage to the electrode needle;

forming a precursor polarization film on a surface of the material to be coated by simultaneously spraying an inert gas and a dielectric solution from the inert gas spraying nozzle and the dielectric solution spraying nozzle, respectively;

discharging the solution remaining in the dielectric solution spraying nozzle by moving the coating sprayer outside the material to be coated and supplying the inert gas to the dielectric solution spraying nozzle through the bypass channel; and performing the electric field polarization after moving the coating sprayer to face the material to be coated again.

5. A device for forming the piezoelectric/pyroelectric film on the material to be coated by the electric field coating and electric field polarization according to claim 4, wherein the coating sprayer is attached to a handling device having a joint with two or more axes.

6. A device for forming the piezoelectric/pyroelectric film on the material to be coated by the electric field coating and electric field polarization according to claim 4, wherein a heater for heating the material to be coated is provided in the receiving jig for setting and mounting the material to be coated.

7. A method for forming a piezoelectric/pyroelectric film on a material to be coated by an electric field coating and electric field polarization, the method comprising the steps of:
 providing a coating sprayer comprising a tip, a dielectric solution spraying nozzle at said tip, an inert gas spraying nozzle at said tip and an electrode needle at said tip;
 providing an inert gas;
 providing a solution with a dielectric substance dissolved in a solvent;
 applying a high voltage of −1 kV to −90 kV to said electrode needle while maintaining the material to be coated in a grounded state to form an electric field between the material to be coated and said coating sprayer, said electrode needle facing a coating surface of the material to be coated;
 spraying an inert gas from said inert gas spraying nozzle at the tip of the coating sprayer onto the material to be coated and simultaneously spraying said solution onto the material to be coated from said dielectric solution spraying nozzle and giving negative charge to droplets of the dielectric solution, while moving the coating sprayer to form a precursor polarization film on the material to be coated, said dielectric solution spraying nozzle having said electrode needle at a center thereof;
 discharging all of said dielectric solution remaining in the dielectric solution spraying nozzle by temporarily stopping the electric field coating, moving the coating sprayer facing the material to be coated to face outside the material to be coated, and discharging the inert gas from the dielectric solution spraying nozzle of the coating sprayer; and
 returning said coating sprayer to a starting position and forming the electric field between the material to be coated and the coating sprayer again, and further polarizing the precursor polarization film to form a piezoelectric/pyroelectric film on the material to be coated.

* * * * *